United States Patent [19]

Schröder

[11] 4,322,636

[45] Mar. 30, 1982

[54] CIRCUIT SYSTEM FOR THE GENERATION OF A DIRECT CONTROL VOLTAGE DEPENDENT UPON AN ALTERNATING VOLTAGE

[75] Inventor: Ernst Schröder, Hanover, Fed. Rep. of Germany

[73] Assignee: Licentia Patent-Verwaltungs-G.m.b.H., Frankfurt am Main, Fed. Rep. of Germany

[21] Appl. No.: 56,972

[22] Filed: Jul. 11, 1979

[30] Foreign Application Priority Data

Jul. 13, 1978 [DE] Fed. Rep. of Germany ....... 2830786

[51] Int. Cl.³ .................. H03K 17/296; H03K 17/28; H03K 4/06
[52] U.S. Cl. .................................. 307/246; 328/127; 328/181; 320/1; 333/14; 330/282; 307/228; 307/494
[58] Field of Search .............. 307/246, 255, 228, 494; 320/1; 330/282; 333/14; 328/127

[56] References Cited

U.S. PATENT DOCUMENTS

| 3,602,825 | 8/1971 | Senior | 307/246 X |
| 3,839,673 | 10/1974 | Acker | 320/1 X |
| 3,965,436 | 6/1976 | Dixon | 333/14 X |
| 3,969,680 | 7/1976 | Wermuth | 330/282 |

*Primary Examiner*—John S. Heyman
*Attorney, Agent, or Firm*—Spencer & Kaye

[57] ABSTRACT

A circuit for generating a direct control voltage dependent on an alternating voltage, particularly for the generation of a direct control voltage in a system for dynamic compression and expansion, including a storage capacitor for providing the control voltage, at least one electronically controllable charging circuit and at least one electronically controllable discharging circuit connected to the storage capacitor, a comparator for comparing an alternating voltage input signal with a reference value, first and second control circuit paths for connecting the output of the comparator to the control inputs of the charging circuit and the discharging circuit respectively, a time-delay circuit connected in one of the control circuit paths, and an inverter connected in one of the control circuit paths so that the output signals from the two control circuit paths are inverted with respect to one another.

11 Claims, 4 Drawing Figures

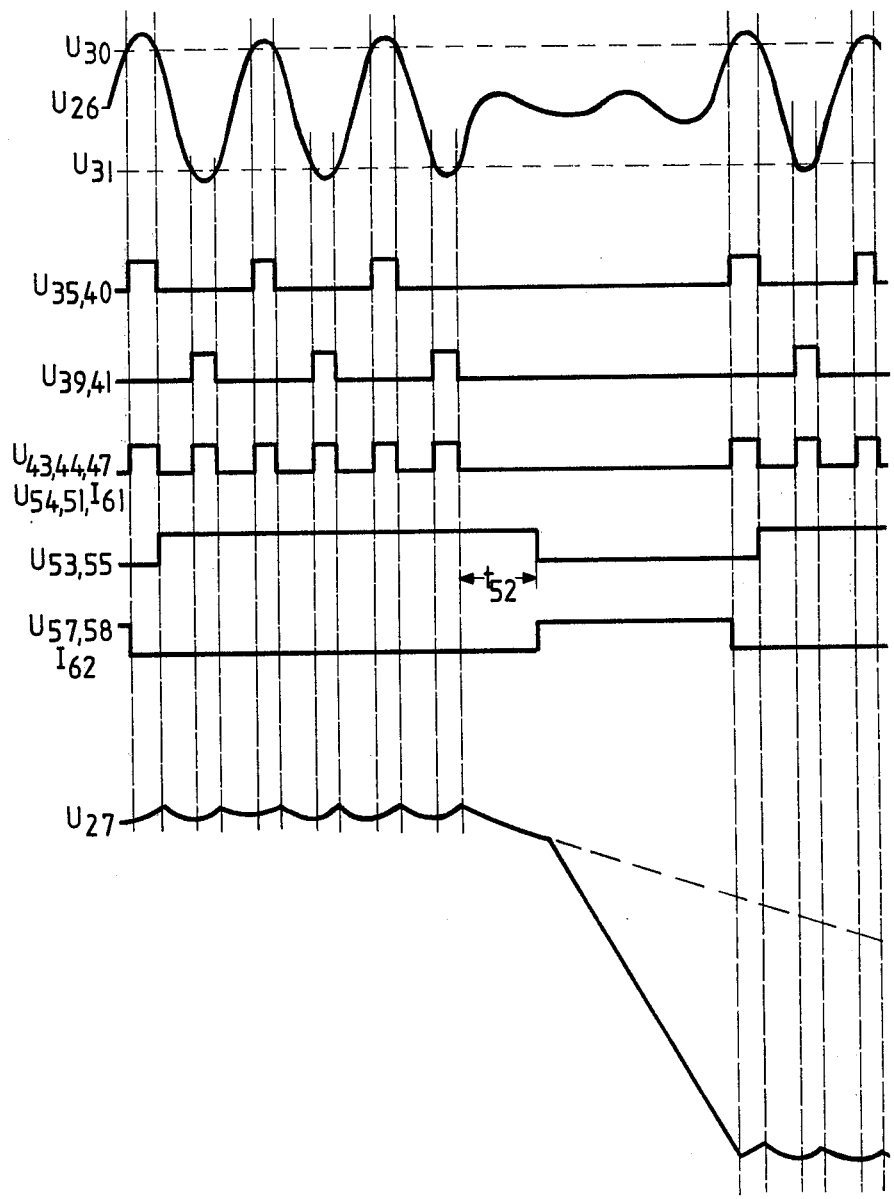

CIRCUIT SYSTEM FOR THE GENERATION OF A DIRECT CONTROL VOLTAGE DEPENDENT UPON AN ALTERNATING VOLTAGE

BACKGROUND OF THE INVENTION

The invention relates to a circuit for the generation of a direct control voltage dependent upon an alternating voltage including a charging capacitor which can be charged through at least one charging circuit and can be discharged through at least one discharging circuit which is particularly suited for the generation of a direct control voltage in a system for dynamic compression and expansion.

The German Patent Specification 24 06 258 corresponding to U.S. Pat. No. 3,969,860 issued July 13, 1976 to J. Wermuth has disclosed the use of a circuit of this kind as a control voltage generator in a compander system.

In the disclosed compander system, depending on whether "compression" or "expansion" is desired, to the input of the control voltage generator is supplied a signal derived respectively from the alternating voltage output signal or the alternating voltage input signal of an amplifier located in the useful signal path, the amplification of which is electronically controllable (adjustable) via another electronically controllable amplifier. The direct voltage output signal of the control voltage generator is fed both into the control input of the amplifier located in the useful signal path and also to the control input of the further amplifier. The control voltage generator acts in this context so that on exceeding of a threshold value by the alternating voltage fed into its input, the control voltage generator generates a quickly rising direct voltage which varies the amplification of the amplifier located in the useful signal path until the alternating voltage at the input of the control voltage generator has dropped back below the threshold value.

One example of an embodiment of the prior art control voltage generator disclosed in the patent comprises a charging capacitor, one terminal of which is connected to earth and the other terminal of which is wired, on one hand, through a charging resistance to an operating voltage (supply) and, on the other hand, through a discharge transistor to earth. The alternating potential fed into the transistor base is rectified in the transistor. On transgression of a threshold value by the alternating voltage at the transistor base, the capacitor charged through the resistance is simultaneously relatively swiftly discharged through the instantaneously current conducting switched transistor. In contrast to this very fast discharge of the charge capacitor, its charging is mainly determined by the magnitude of the charging resistance.

It had been found, e.g., in the case of an expander circuit, that two inherently contradictory requirements have to be fulfilled in the described charging of the charging capacitor. The charging should, on one hand, proceed as rapidly as possible so that in the event of a suddenly occurring prolonged decrease in the amplitude of the useful signal requiring to be processed, it is possible to effect a quick correction in the amplification of the amplifier located in the useful signal path. Undesirable noise signals would otherwise become audible in such a case during the long transition time caused by the slow charging. Charging should, on the other hand, not proceed too rapidly to avoid that, in the case of the lowest frequencies to be processed, control is so fast as to produce distortions of the pure sinusoidal oscillations with the lowest frequencies. This problem is particularly manifested in wide band compander systems because, in such systems, all frequency ranges including even the lowest frequencies are processed in the one single available channel.

The above considerations apply correspondingly also, when in another example of an embodiment of the prior art control voltage generator disclosed in the patent, not discharging but charging is effected through a transistor. The above considerations apply in this case to the discharge of the charging capacitor.

A compromise has to be made in the choice of the charge and discharge time constants to meet the aforementioned contradictory requirements.

SUMMARY OF THE INVENTION

The invention has the object of providing a circuit in which the aforesaid compromise can be solved better so that there is an improvement either in the behaviour of the circuit in respect of the undesirable audible noise signals (noise behaviour) at relatively slight distortion or in the behaviour in respect of the distortions at relatively good noise behaviour.

The above object is achieved according to the present invention by a circuit for the generation of direct control voltage dependent on an alternating voltage utilizing a storage capacitor, particularly for the generation of a direct control voltage in a system for dynamic compression and expansion, including a storage capacitor for providing the control voltage, at least one electronically controllable charging circuit and at least one electronically controllable discharging circuit connected to the storage capacitor for discharging same respectively, and a comparator means for comparing an alternating voltage input signal with a reference value and for producing an output signal corresponding to the results of the comparison, a first and a second control circuit path for connecting the output of the comparator means to the control input of the charging circuit and to the control input of the discharging circuit respectively, a time-delay circuit, connected in one of the first and second control circuit paths, and inverting means connected in one of the first and second control circuit paths for causing the output signals from the control paths to be inverted with respect to one another.

BRIEF DESCRIPTION OF THE DRAWINGS

The invention will be explained in greater detail with the aid of two examples of embodiments which are shown in the drawings, wherein:

FIG. 4 shows the voltage and current patterns at various parts of the circuit of FIG. 3.

DETAILED DESCRIPTION OF THE PREFERRED EMBODIMENTS

Figure 1:
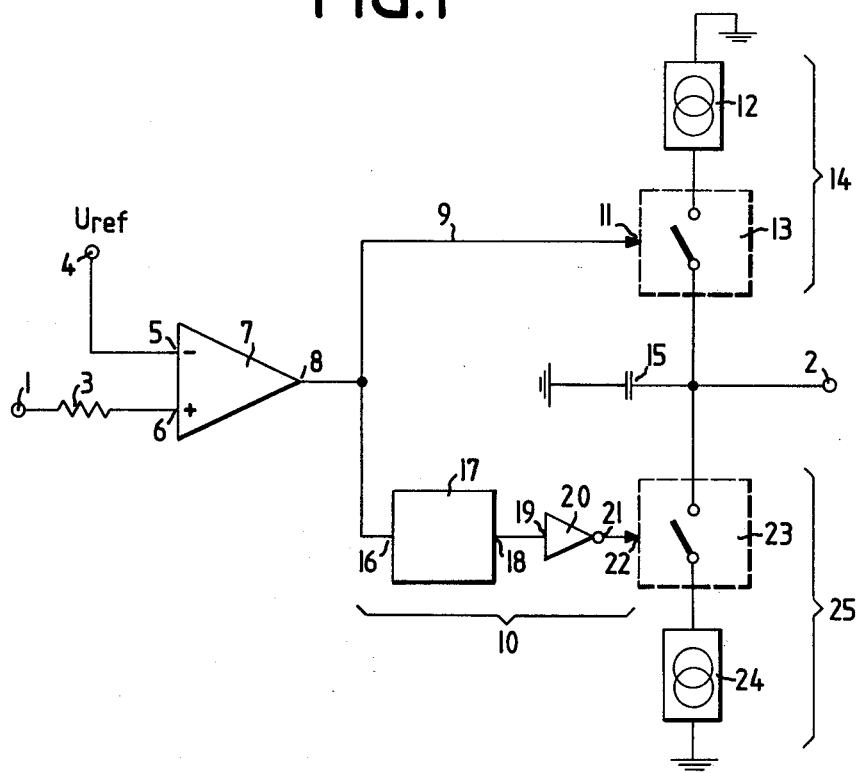
FIG. 1 shows the basic diagram of the circuit in accordance with the invention.

FIG. 1 shows the basic diagram of the circuit in accordance with the invention. Such a circuit is typically insertable as the control voltage generator into the function blocks designated by the reference numeral 5 of the circuit shown in FIGS. 1 and 2 of U.S. Pat. No. 3,969,680 cited above.

The circuit in accordance with the invention has an input 1 for the alternating voltage and an output 2 for the direct control voltage. The input 1 is wired through a resistance 3 to a non-inverting input 6 of a differential amplifier 7. A reference voltage is fed through input terminal 4 into the inverting input 5. The differential amplifier 7 acts as comparator and may occupy a first output state characterised by low potential (L-potential) and a second output state characterised by high potential (H-potential). The first output state occurs when the alternating input voltage $U_1$ is smaller than the reference voltage $U_4$; the second output state occurs when the alternating input voltage $U_1$ is larger than the reference voltage $U_4$. From the output 8 of the differential amplifier 7 branch a first control path 9 to the control input 11 of an electronically controllable charging current path 14 and a second control path 10 to the control input 22 of an electronically controllable discharge current path 25. The charging current path 14 and the discharge current path 25 are wired to a contact of a charging capacitor 15. The other contact of the charging capacitor 15 is applied to a reference voltage (earth). The common junction of the charging current path 14, of the discharge current path 25 and the charge capacitor 15 is connected with the output 2. The electronically controllable current path 14 contains a current source 12 and an electronically controllable switch 13, which is controllable through a control input 11. The electronically controllable discharge current path 25 contains a current source 24 and an electronically controllable switch 23 which is controllable through a control input 22. The control input 11 of the charging current path is directly wired through the control path 9 to the output 8 of the differential amplifier 7 whereas an inverter 20 is inserted in the control path 10 between the control input 22 of the discharge current path 25 and the output 8 of the differential amplifier 7. Moreover, in the control path 10, the output 8 of the differential amplifier 7 is wired to the input 16 of a time-lag or delay element 17 whose output 18 is wired to an input 19 of the inverter 20 whose output 21, in turn, is wired to the control input 22 of the electronically controllable discharge current path 25.

The circuit is suitable as a control voltage generator for compander systems of the kind which feed a constant dynamic alternating voltage signal to the control voltage generator in the stationary state and in the event of input side amplitude jumps only give rise to short time span amplitude variations which are, however, then restored by the control circuit to the stationary value. In the stationary state, the alternating input voltage at the input terminal 1 settles down to a peak value which just exceeds the value of the reference voltage applied to the terminal 4.

Figure 2:
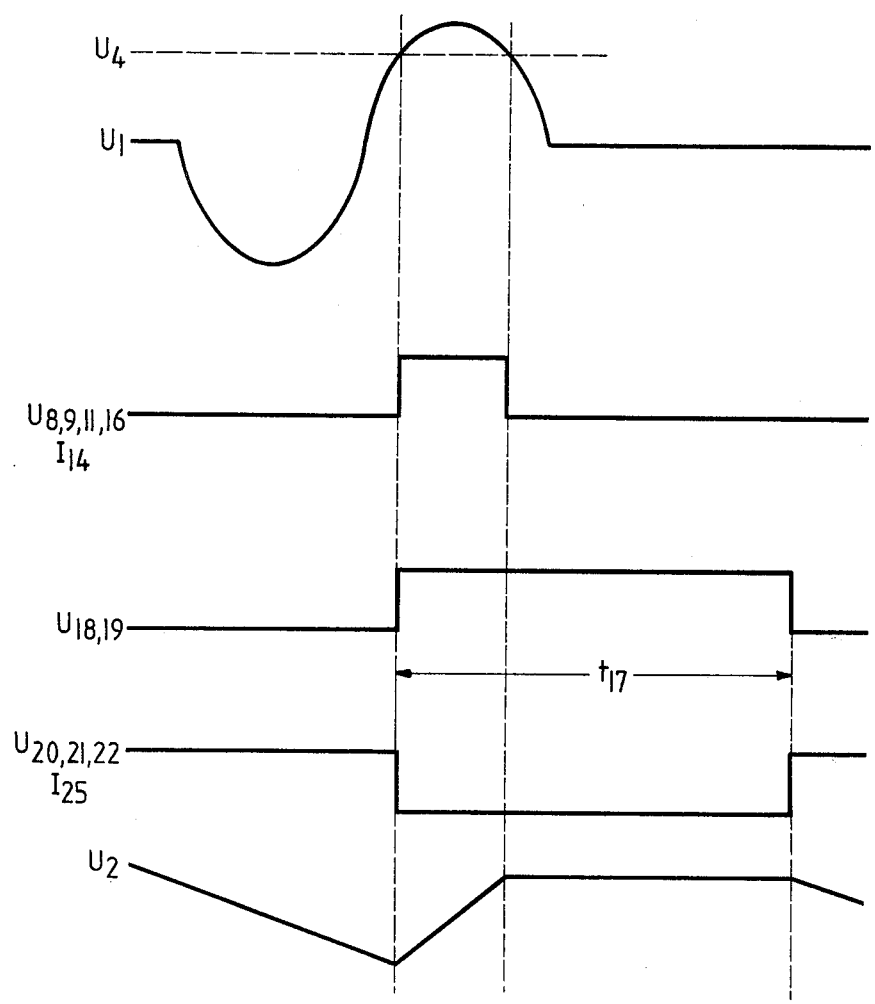
FIG. 2 shows the voltage and current patterns at various parts of the circuit of FIG. 1.

This relationship is shown in FIG. 2 by the potential patterns designated with $U_1$ and $U_4$. For the case when the alternating voltage peak $U_1$ exceeds the reference voltage $U_4$, the output 8 of the differential amplifier 7 takes on the second output state for the duration of this transgression. The pattern of the output voltage at the output 8 of the differential amplifier 7 is shown by the curve designated by $U_8$. The voltage $U_9$ in the control lead 9 and the current $I_{14}$ through the charging current path 14 have the same shapes as $U_8$ and are shown as one curve. An H-potential at the output 8 is passed through the control lead 9 to the control input 11 of the electronically controllable charging current path 14 and renders the current path 14 conducting. A current $I_{14}$ is fed to the charge capacitor 15. The voltage $U_8$ at the output 8 of the differential amplifier 7 is simultaneously applied to the input 16 of the time-lag element 17. The time-lag element 17 is a post-triggerable monostable trigger stage and flips into the unstable state. The output signal $U_{18}$ of the monostable trigger stage 17 is inverted to signal $U_{20}$ in the inverter 20 and fed to the control input 22 of the discharge current path 25. The current path 25, whose switching state is shown by the curve $I_{25}$, is controlled to be non-conducting.

The differential amplifier 7 readopts the first output state, i.e., an L-potential at the output 8, for the case where the alternating input voltage $U_1$ no longer exceeds the value of the reference voltage $U_4$. This makes the charging current path 14 non-conducting. The monostable trigger stage 17 maintains the unstable state for a delay time $t_{17}$ in the other control path. After lapsing of the delay time, the stage 17 flips back into the stable state. This renders the discharge circuit 25 conducting. This just described performance sequence has the effect on a direct control voltage $U_2$ tappable at the output terminal 2 that it maintains its value during the delay time $t_{17}$ when the peak of the alternating input voltage $U_1$ no longer reaches the threshold value preset by the reference voltage $U_4$. The direct control voltage is changed only after lapsing of the delay time $t_{17}$. This prevents distortion by control actions of the shape of the curve of the alternating voltage signal passing through the compander.

In the case of the shown example, an alternating input voltage exceeding the value of the reference voltage leads to an increase in the direct control voltage. When, however, a contrary (opposed polarity) variation of the direct control voltage in relation to the alternating input voltage is required for the control of the correcting elements in an amplifier with variable transfer constant, it becomes necessary to change over the charging current path and the described circuit.

Figure 3:
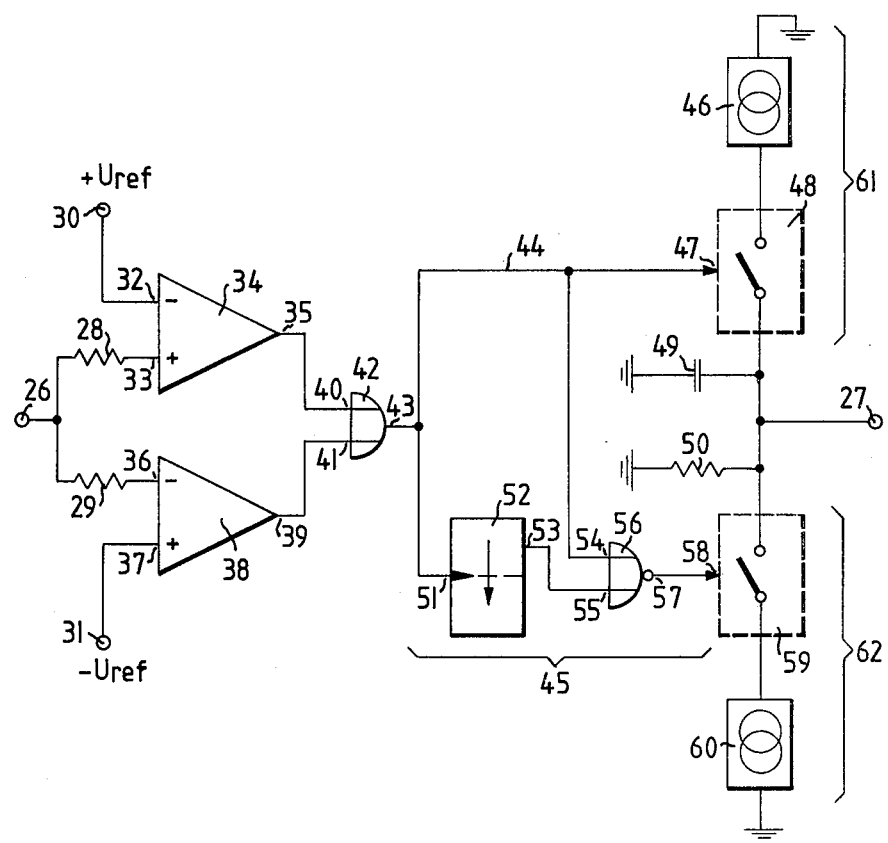
FIG. 3 shows a preferred embodiment of a circuit in accordance with the invention.

A beneficial improvement of the invention is shown in FIG. 3. The circuit has an input 26 for the alternating voltage and an output 27 for the direct control voltage. The input 26 is connected through a first resistance 28 with a non-inverting input 33 of a first differential amplifier 34 and through a second resistance 29 with an inverting input 36 of a second differential amplifier 38. A positive reference voltage is supplied through an input terminal 30 to an inverting input 32 of the first differential amplifier 34 and a negative reference voltage is supplied through an input terminal 31 to a non-inverting input 37 of the second differential amplifier 38. Outputs 35, 39 of the two differential amplifiers are wired to the inputs 40, 41 of a first OR-logical element or gate 42. The previously described circuit operates as a comparator, whereby one output 43 of the OR-logical element 42 can take on a first and a second output state. The first output state occurs when the positive half wave of the alternating voltage at input 26 is smaller than the positive reference voltage and the negative half wave of the alternating voltage is larger, i.e., more positive, than the negative reference voltage. The second output state occurs when the positive half wave is larger than the positive reference voltage or the negative half wave is smaller, i.e., more negative, than the negative reference voltage. From the output 43 of the OR-logical element 42 branch a first control path 44 to a control input 47 of an electronically controllable charging current path 61 and a second control path 45 to a control input 58 of an electronically controllable discharge current path 62. The charging current path 61 and the discharge current path 62 are wired to a contact of a charging capacitor 49. The other contact of the charging capacitor 49 is wired to a reference voltage (earth). The common junction of the charging capacitor 49, the charging current path 61 and the discharge current path 62 is wired to the output 27 and the one contact of a resistance 50. The other contact of the resistance 50 is wired to a reference voltage (earth). The resistance 50 is a non-controllable discharge current path. The electronically controllable charging current path 61 comprises a current source 46 and an electronically controllable switch 48 controllable through the control input 47. The electronically controllable discharge current path 62 comprises a current source 60 and an electronically controllable switch 59, which is controllable through the control input 58. The control input 47 of the charging current path 61 is directly connected with the output 43 of the first OR-logical element 42. The second control path 45 between the output 43 of the first OR-logical element 42 and the control input 58 of the electronically controllable discharge current path 62 contains the series circuit comprising a post-triggerable monostable trigger stage 52 and an inverting OR-element (NOR) or gate 56. In this control path 45, the output 43 of the first OR-logical element 42 is wired to a negative flank responding trigger input 51 of the monostable trigger stage 52. One output 53 of the monostable trigger stage 52 is wired to one input 55 of the inverting OR-element 56. The output 57 of the inverting OR-element 56 is wired to the control input 58 of the controllable discharge current path 62. Another input 54 of the inverting OR-element 56 is wired to the first control path 44.

The voltage and current patterns of the circuit of FIG. 3 are shown in FIG. 4. The indices of the curves designated with the letters U for voltage and I for current correspond to the reference symbols of the circuit parts in FIG. 3 at which voltages and currents occur.

On employment of the circuit in a closed control circuit, there will arise in the stationary state such a value for the alternating input voltage $U_{26}$ that its peaks just exceed the limits preset by the two reference voltages $U_{30}$, $U_{31}$, i.e., they exceed the positive reference voltage $U_{30}$ and fall below the negative reference voltage $U_{31}$. For the duration of the transgression, each output 43 of the OR-logical element 42 takes on the second output state ($U_{43}$). In the present case, a low potential (L-potential) corresponds to the first output state, and a high potential (H-potential) corresponds to the second state. The control input 47 of the electronically controllable charging current circuit 61 is directly connected through the first control path 44 with the output 43 of the OR-logical element 42. The charging current path 61 is controlled to be current conducting ($I_{61}$) when H-potential is applied to the control input 47 ($U_{47}$).

In its stationary state, the charging capacitor 49 ($U_{49}$) is periodically charged through the charging current path 61 ($I_{61}$). This will occur specifically for as long as the alternating voltage input peaks ($U_{26}$) exceed the limits preset by the reference voltages $U_{30}$, $U_{31}$. The charge slowly draining away through the discharge resistance 50 is just compensated by the periodically occurring charging.

The discharge current path 62 ($I_{62}$) is controlled to be non-conducting during the time span in which the charging current path 61 ($I_{61}$) is controlled to be conducting at its control input (47) by H-potential. This control is achieved by the inverting OR-element 56 whose output takes on L-potential when one or both inputs 54, 55 are triggered with H-potential. Since the input 54 is connected with the control path 44, an H-potential in the control path 44 will produce an L-potential at the control input 58 of the discharge current path 62 and thereby its blockage. In this way, it will be prevented that both electronically controllable current paths can become current conducting simultaneously as a result of which an uncontrolled charging state would be produced in the capacitor 49.

Whenever the instantaneous value of the alternating input voltage $U_{26}$ returns, after exceeding the limits preset by the reference voltages $U_{30}$, $U_{31}$, back to the zone lying between these limits, the output 43 of the first OR-logical element 42 returns also from the second switching state (H-potential) to the first switching state (L-potential). The thereby occurring negative pulse flank at the input 51 ($U_{51}$) of the post-triggerable monostable trigger stage 52 then switches the trigger stage 52 to the unstable state, which in the present case is characterised by H-potential at the output 53 ($U_{53}$). Since, in the event of a constant alternating current input signal $U_{26}$ at the input 26, the output 43 of the OR-logical element 42 switches in every oscillation period twice to and fro between H-potential and L-potential ($U_{43}$), the monostable trigger stage 52 is periodically triggered and maintains its unstable switching state ($U_{53}$).

On variation of the alternating input voltage, the new value of the direct control voltage at the output 27 is obtained by variation of the time in which the charging current path 61 is controlled to be current conducting. The charging capacitor 49 receives a raised final charging voltage when the "current conducting" switching state is extended; on shortening of the "current conducting" switching state, the continuous discharge through the resistance 50 is not correspondingly compensated and the final charging voltage is reduced. In the latter case, the speed at which the control voltage can vary towards lower values is initially limited by the time constants of the capacitor 49 and of the resistances 50.

In none of the cases considered so far comprising
 1. stationary state of the alternating input voltage,
 2. increase of the alternating input voltage at an arbitrary speed, and
 3. slow falling off of the alternating input voltage, has there been an activation of the electronically controllable discharge current path 62. This changes when the alternating input voltage falls from a finite value very rapidly to a low value and maintains this low value.

As soon as the alternating input voltage $U_{26}$ no longer reaches the critical value given by the reference voltages $U_{30}$, $U_{31}$, the output 43 of the OR-logical element will cease to take on H-potential but will retain L-potential ($U_{43}$). Consequently, the charging capacitor 49 no longer will be recharged through the charging current path 61 and will slowly lose charge through the resistance 50.

Since no more trigger pulses are supplied to the input 51 of the trigger stage 52, it will remain in the unstable state only for the delay time $t_{52}$ counted from the last trigger pulse. If after lapsing of the delay time $t_{52}$ the output 43 has still L-potential ($U_{43}$), both inputs 54, 55 of the inverting OR-logical element will receive L-potential whereupon the output 57 takes on H-potential ($U_{57}$) and the electronically controllable discharge current path 62 ($I_{62}$) is controlled to be current conducting. The discharge of the charging capacitor 49 ($U_{49}$) takes place then very much faster than previously through the resistance 50.

If following this the alternating input voltage rises again and exceeds the limits preset by the reference voltages, the output 43 of the OR-logical element 42 will then again take on H-potential as a consequence of which the discharge circuit 62 will be controlled to be non-conducting and the charging circuit 61 be controlled to be current conducting.

The behaviour of the circuit in accordance with the invention after a rapid falling off in the alternating input voltage has the result that, on one hand, there occurs no falsification of the curve of the dying down useful signal and that, on the other hand, the transfer constant of the controllable amplifier is changed well in time so that no interfering noise is noticeable.

The advantage of a circuit per FIG. 3 with two comparators over a circuit per FIG. 1 with one comparator is that for the achievement of a given low non-linear distortion factor during variation in amplifaction, the delay time $t_{52}$ has to be chosen only half as large as the delay time $t_{17}$ in a circuit with only one comparator. In a circuit per FIG. 1, it is, e.g., only possible to detect the positive half-wave of an input signal. Consequently, in this circuit it will not be recognised whether or not the positive half-wave is followed by a negative half-wave and this has to be allowed for through the choice of an appropriately longer delay time.

Another difference between the circuit shown in FIG. 3 and that shown in FIG. 1 is that a trigger pulse is not supplied by the monostable trigger stage 52 at the instant at which the instantaneous value of the alternating input voltage exceeds one of the limits preset by the reference voltages, but only at the instant in which the instantaneous value of the alternating input voltage returns again into the zone between these limits. Compared with FIG. 1, it is possible to reduce the delay time of the monostable trigger stage by the value by which a very low frequency alternating voltage could exceed one of the limits preset by the reference voltages. A long delay time is, however, unnecessary at high frequencies in respect of the non-linear distortion factor and prevents a fast correction of the transfer constant.

In cases where the circuit per FIG. 3 is used to achieve a variation of the direct control voltage opposite (of opposed polarity) to the change in the alternating input voltage, it is necessary to design the current path 62 as a charging current path and the current path 61 as a discharge current path. The other pole of the resistance 50 must furthermore be connected with another reference voltage.

It is also possible to design the comparator so that the outputs vary their output states from H-potential to L-potential when the alternating input voltage exceeds the limits preset by the reference voltages. The remaining circuit may also be designed in negative logic. The OR-logical element would, e.g., have to be replaced by an AND-logical element and the inverting OR-logical element by an inverting AND-element. It would also be necessary to employ a monostable trigger stage with a trigger input which responds to the positive flank and, likewise, an inverting output to the output 53. It is finally possible to design a combined positive and negative logic circuit.

It is furthermore possible to design the resistance 50 in the form of a constant current source and the current source 60 in the form of a resistance.

In a beneficial form of embodiment of the system in accordance with the invention, the delay time of the monostable trigger stage should be about 25 ms. This will have the result that a non-linear distortion factor due to the control system is, down to a lowest frequency of 20 Hz, determined (governed) only by the time constant of the resistance 50 and of the capacitor 49. The time constant formed from the charging capacitor 49 and the combined discharge current circuit comprising the resistance 50 and the current path 60 can be rated so small that a correspondingly short transition time for the correction of the electronically controllable amplifier will be achieved when the level of the useful signal drops suddenly. This transition time, which is made up by the constant delay of 25 ms and the rapid discharge time of, e.g., 150 ms, can in fact be made shorter than the time required by the human ear to readapt itself to low-level noises after abruptly ceasing loud noises. Noise signals which occur during the transitional correction time will, therefore, not be noticed.

I claim:

1. A circuit for the generation of a direct control voltage dependent on an alternating voltage by means of a storage capacitor, particularly for the generation of a direct control voltage in a system for dynamic compression and expansion, comprising in combination:

a storage capacitor for providing the control voltage;

at least one electronically controllable charging circuit connected to said storage capacitor for charging same;

at least one electronically controllable discharging circuit connected to said storage capacitor for discharging same;

comparator means for comparing an alternating voltage input signal with a reference value and for producing an output signal corresponding to the results of the comparison;

a first control circuit path for connecting the output of said comparator means to the control input of said charging circuit;

a second control circuit path for connecting the output of said comparator means to the control input of said discharging circuit;

a time delay circuit connected in one of said first and second control circuit paths, said time delay circuit including a monostable trigger stage which responds to a change in its input potential; and inverting means connected in one of said first and second control circuit paths for causing the output signals from said control paths to be inverted with respect to one another.

2. The circuit defined in claim 1 wherein said comparator means is a differential amplifier for comparing said alternating voltage input signal with a reference signal and for producing a change in its output signal whenever the alternating voltage input signal exceeds or falls below the magnitude of said reference voltage.

3. The circuit defined in claim 1 wherein said comparator means includes first and second comparators for comparing said alternating voltage input signal with respective first and second reference voltages, and a logic element for logically combining the output of said first and second comparators and whose output comprises said output of said comparison means.

4. The circuit defined in claim 3 wherein: said first comparator is a differential amplifier circuit for comparing the positive half-wave of said alternating voltage signal with a positive reference voltage; said second comparator is a differential amplifier circuit for comparing the negative half-wave of said alternating voltage signal with a negative reference voltage; and said logic element is an OR-gate having its two inputs connected respectively to the outputs of said first and second comparators and its output connected to said first and second control current paths.

5. The circuit defined in claim 4, wherein said comparators are adjusted so that their output potential changes when the alternating voltage signal falls below or exceeds the magnitude of the associated reference voltage.

6. The circuit defined in claim 4 or claim 5 wherein the magnitude of said positive reference voltage equals the magnitude of said negative reference voltage.

7. The circuit defined in claim 5 wherein said monostable trigger stage is rated such that it responds to potential changes which correspond to said alternating voltage exceeding said negative reference voltage and said alternating voltage falling below said positive reference.

8. The circuit defined in claim 7 wherein the one of said first and second control circuit paths in which said time-delay circuit is connected contains a further OR-gate, said further OR-gate having first and second inputs connected respectively to the output of said time-delay circuit and to the other of said control circuit paths.

9. The circuit defined in claim 8 wherein said further OR-gate and said inverting means are combined into a NOR-gate.

10. The circuit defined in claim 1, claim 5 or claim 8 including a further non-controllable discharge path connected in parallel with said storage capacitor.

11. The circuit defined in claim 1, claim 5 or claim 8 further including a non-controllable charging path connected to said storage capacitor for charging same.

* * * * *